United States Patent [19]
Craig et al.

[11] Patent Number: 5,525,198
[45] Date of Patent: Jun. 11, 1996

[54] ELECTRORHEOLOGICAL CRYSTALLIZATION OF PROTEINS AND OTHER MOLECULES

[75] Inventors: George D. Craig, Lafayette; Bernhard Rupp, Dublin, both of Calif.

[73] Assignee: The Regents of the University of California, Oakland, Calif.

[21] Appl. No.: 376,612

[22] Filed: Jan. 23, 1995

[51] Int. Cl.$^6$ .................... C10M 171/00; C10M 169/04
[52] U.S. Cl. .................... 204/165; 205/688; 378/73; 378/78; 435/173.1; 435/173.2; 435/173.3
[58] Field of Search .................... 204/131, 165; 378/73, 78; 435/173.1, 173.2, 173.3; 205/688

[56] References Cited

U.S. PATENT DOCUMENTS

| | | | |
|---|---|---|---|
| 5,320,770 | 6/1994 | Conway et al. | 252/75 |
| 5,380,450 | 1/1995 | Conway et al. | 252/75 |

OTHER PUBLICATIONS

Block et al., "Electro-rheology" review article, 1988, pp. 1661-1677.

T. Chen, R. Zitter, and R. Tao, "Laser Diffraction Determination of the Crystalline Structure of an Electrorheological Fluid", Physical Review Letters vol. 68; Apr. 20, 1992, No. 16, pp. 2555-2558.

T. Halsey and J. Martin, "Electrorheological Fluids", Scientific American (Oct. '93), pp. 58-64.

H. Block and J. Kelly, "Electro-Rheology", J. Phys. D: Appl. Phys. 21, 1988 pp. 1661-1677 no month.

*Primary Examiner*—Arun S. Phasge
*Attorney, Agent, or Firm*—Henry P. Sartorio

[57] ABSTRACT

An electrorheological crystalline mass of a molecule is formed by dispersing the molecule in a dispersion fluid and subjecting the molecule dispersion to a uniform electrical field for a period of time during which time an electrorheological crystalline mass is formed. Molecules that may be used to form an electrorheological crystalline mass include any organic or inorganic molecule which has a permanent dipole and/or which is capable of becoming an induced dipole in the presence of an electric field. The molecules used to form the electrorheological crystalline mass are preferably macromolecules, such as biomolecules, such as proteins, nucleic acids, carbohydrates, lipoproteins and viruses.

Molecules are crystallized by a method in which an electric field is maintained for a period of time after the electrorheological crystalline mass has formed during which time at least some of the molecules making up the electrorheological crystalline mass form a crystal lattice.

The three dimensional structure of a molecule is determined by a method in which an electrorheological crystalline mass of the molecule is formed, an x-ray diffraction pattern of the electrorheological crystalline mass is obtained and the three dimensional structure of the molecule is calculated from the x-ray diffraction pattern.

54 Claims, 4 Drawing Sheets

ELECTRORHEOLOGICAL CRYSTALLIZATION OF PROTEINS AND OTHER MOLECULES

The United States government has rights in this invention pursuant to Contract Number W-7405-ENG-48 between the United States Department of Energy and the University of California for the operation of Lawrence Livermore National Laboratory.

BACKGROUND OF THE INVENTION

1. Field of the Invention

The present invention relates to the use of electrorheology to form electrorheological crystalline masses of molecules, preferably macromolecules such as proteins, nucleic acids, carbohydrates, lipoproteins and viruses, through alignment of the molecule's permanent and/or induced dipole moments within a uniform electric field. The present invention also relates to the formation of electrorheological crystalline masses of molecules as a method for facilitating the formation of x-ray diffraction quality crystals of the molecules. One particular application of the present invention is the crystallization of proteins and their subsequent characterization by x-ray diffraction.

2. Description of Related Art

One of the fundamental problems faced by the biotechnology industry is a lack of knowledge regarding the three dimensional structures of the molecules being studied. X-ray crystallography is presently the only effective method known for determining the three dimensional structure of large molecules, referred to herein as macromolecules, such as proteins, nucleic acids, carbohydrates, lipoproteins and viruses, at a near atomic resolution level. X-ray crystallography works by exposing a crystal, i.e., a periodic lattice of like molecules, to x-rays. X-rays have a wavelength near 1Å which is roughly equivalent to the interatomic spacings in crystals. As x-rays traverse a crystal, the x-rays are diffracted by the individual atoms in the crystal, thereby creating an x-ray diffraction pattern. The x-ray diffraction pattern can then be used to calculate the spatial relationships of the atoms of the molecule making up the crystal, i.e., the x-ray diffraction pattern can be used to determine the molecule's three dimensional structure.

In order to perform x-ray crystallography, one must first obtain an x-ray diffraction quality crystal. A diffraction quality crystal is a crystal whose periodic lattice has sufficiently few defects and distortions so as to create a consistent x-ray diffraction pattern, thereby enabling one to determine the three-dimensional structure of the molecule forming the crystal. The atomic resolution of the three dimensional structure calculated from an x-ray diffraction pattern depends on the number of distortions and defects in the crystal's periodic lattice.

Macromolecules, such as proteins, nucleic acids, carbohydrates, lipoproteins and viruses are frequently extremely difficult to crystallize. As a result, x-ray crystal structures for many macromolecules are either not available or extremely difficult to obtain. For example, most protein crystals initially form soft, nearly gelatinous lattices with a high solvent content and resulting distortions and defects. In order to improve the resolution-determining diffraction quality of the protein crystal, the scientist must continually modify the crystallization conditions such as solvent composition, temperature, salts, precipitants and pH, largely through trial and error. Crystallization thus is generally an iterative process which frequently takes many years before a diffraction quality crystal is produced.

The difficulty associated with generating x-ray diffraction quality crystals of macromolecules is evidenced by the fact that crystal structures have only been determined for about 1% of the more than 100,000 protein sequences that are presently known. Scientists thus are generally forced to study the physical properties of a molecule and to design compounds, such as drugs which recognize and bind to the molecule, without ever knowing the three dimensional structure of the molecule being studied. An improved method for generating x-ray diffraction quality crystals is therefore needed in order to enable the determination of the three dimensional structure of a greater number of macromolecules, particularly proteins.

Crystallization, in general, is the self-assembly of molecules into a periodic lattice. In order for the molecules to self-assemble into a crystal, several molecules must first come together with the proper orientation and initiate the periodic lattice. In order for the periodic lattice to grow, additional molecules must come into contact with the periodic lattice with the proper orientation. Because crystallization requires the self-assembly of molecules in an ordered fashion, there is a significant entropy barrier to crystallization. A method for reducing the entropy barrier to crystallization is needed. The present invention relates to the use of electrorheology to form highly ordered electrorheological crystalline masses of molecules which facilitate the formation of x-ray diffraction quality crystals of molecules.

Electrorheology is a phenomenon by which macroscopic particles dispersed within a dispersion fluid form an electrorheological solid when subjected to a uniform electric field.

In general, electrorheology involves the placement of a dispersion of macroscopic particles capable of forming an induced dipole within a uniform electric field. When the polarizable macroscopic particles are subjected to a uniform electric field, the positively charged protons inside the macroscopic particles are attracted to the negative pole of the uniform electrical field and the negatively charged electrons are attracted to the positive pole of the uniform electrical field. As a result, positive and negative charges are shifted within each macroscopic particle by the electric field, thereby causing the macroscopic particle to become an induced electric dipole.

When the macroscopic particles are subjected to a uniform electric field, the attractive and repulsive forces exerted on the macroscopic particles due to their induced dipole moments cause the macroscopic particles to line up relative to each other, positive dipole end to negative dipole end, forming chains of macroscopic particles. The chains of macroscopic particles quickly grow in length until the chain extends to the opposing ends of the chamber holding the electrorheological dispersion. Meanwhile, the chains combine to form chains of increasing thicknesses until an electrorheological solid of macroscopic particles is formed. Electrorheology was first described in U.S. Pat. No. 2,417, 850 and has more recently been described in Halsey, et al. *Scientific American* (1993) 58–64, Chen, et al., *Phys. Rev. Lett.* (1992) 68:2555, and Block, et al., *J. of Physics D: Applied Physics* (1988) 21:1661–1677, each of which is incorporated herein by reference.

To date, electrorheology has only been performed on macroscopic particles having a diameter of between about 0.04–50 µm. It is an object of the present invention to perform electrorheology on molecules, as opposed to macroscopic particles, in order to facilitate the crystallization of the molecules through the formation of an electrorheological crystalline mass of molecules.

SUMMARY OF THE INVENTION

The present invention relates to an electrorheological crystalline mass of a molecule formed by dispersing the molecule in a dispersion fluid and subjecting the molecule dispersion to a uniform electrical field for a period of time during which time an electrorheological crystalline mass is formed. Molecules that may be used to form an electrorheological crystalline mass include any organic or inorganic molecule which has a permanent dipole and/or which is capable of becoming an induced dipole in the presence of an electric field. The molecules used to form the electrorheological crystalline mass are preferably macromolecules, such as biomolecules, such as proteins, nucleic acids, carbohydrates, lipoproteins and viruses.

The present invention also relates a method for crystallizing molecules by maintaining the electric field for a period of time after the electrorheological crystalline mass has formed during which time at least some of the molecules making up the electrorheological crystalline mass form a crystal lattice.

The present invention also relates to a method for determining the three dimensional structure of a molecule by forming an electrorheological crystalline mass of the molecule, obtaining an x-ray diffraction pattern of the electrorheological crystalline mass and calculating the three dimensional structure of the molecule from the x-ray diffraction pattern.

The present invention also relates to a method for determining the three dimensional structure of a molecule by forming a crystal lattice from an electrorheological crystalline mass, obtaining an x-ray diffraction pattern of the crystal and calculating the three dimensional structure of the molecule from the x-ray diffraction pattern.

One particular application of the present invention is the crystallization and characterization of proteins. Using the methods of the present invention, proteins may be rapidly crystallized, thereby enabling protein structural characterization by x-ray crystallography.

DESCRIPTION OF THE PREFERRED EMBODIMENTS

The present invention relates to the use of electrorheology to form electrorheological crystalline masses of molecules through alignment of the molecules' permanent and/or induced dipole moments within a uniform electric field. The present invention also relates to the formation of electrorheological crystalline masses of molecules as a method for facilitating the formation of x-ray diffraction quality crystals of molecules. One particular application of the present invention is the crystallization and characterization of proteins.

In addition to facilitating crystallizations, some electrorheological crystalline masses of molecules are expected to possess unusual physical properties due to the highly ordered nature of the crystalline mass. For example, some molecules may yield electrorheological crystalline masses possessing novel optical and electrical properties such as non-linear optical properties and superconductivity.

The methods of the present invention may be used with any molecule which has a permanent dipole and/or which is capable of becoming an induced dipole in the presence of an electric field. The molecules are preferably macromolecules, such as biomolecules, such as proteins, nucleic acids, carbohydrates, lipoproteins and viruses.

The present invention is distinguished from prior art electrorheological procedures in that the present invention is directed to performing electrorheology on molecules, preferably molecules having a diameter equal to or less than about 1 μm, more preferably less than about 0.04 μm. To date, electrorheology has only been performed on macroscopic particles having a diameter of between about 0.04–50 μm.

As used here, an electrorheological crystalline mass refers to an ordered array of a molecule formed by the application of a uniform electric field where the molecules in the array are aligned such that the permanent and/or induced dipole moments of the molecules are aligned with the uniform electric field. The self-assembly of the molecules into an electrorheological crystalline mass is hereinafter referred to as the "electrorheological effect."

Figure 1:
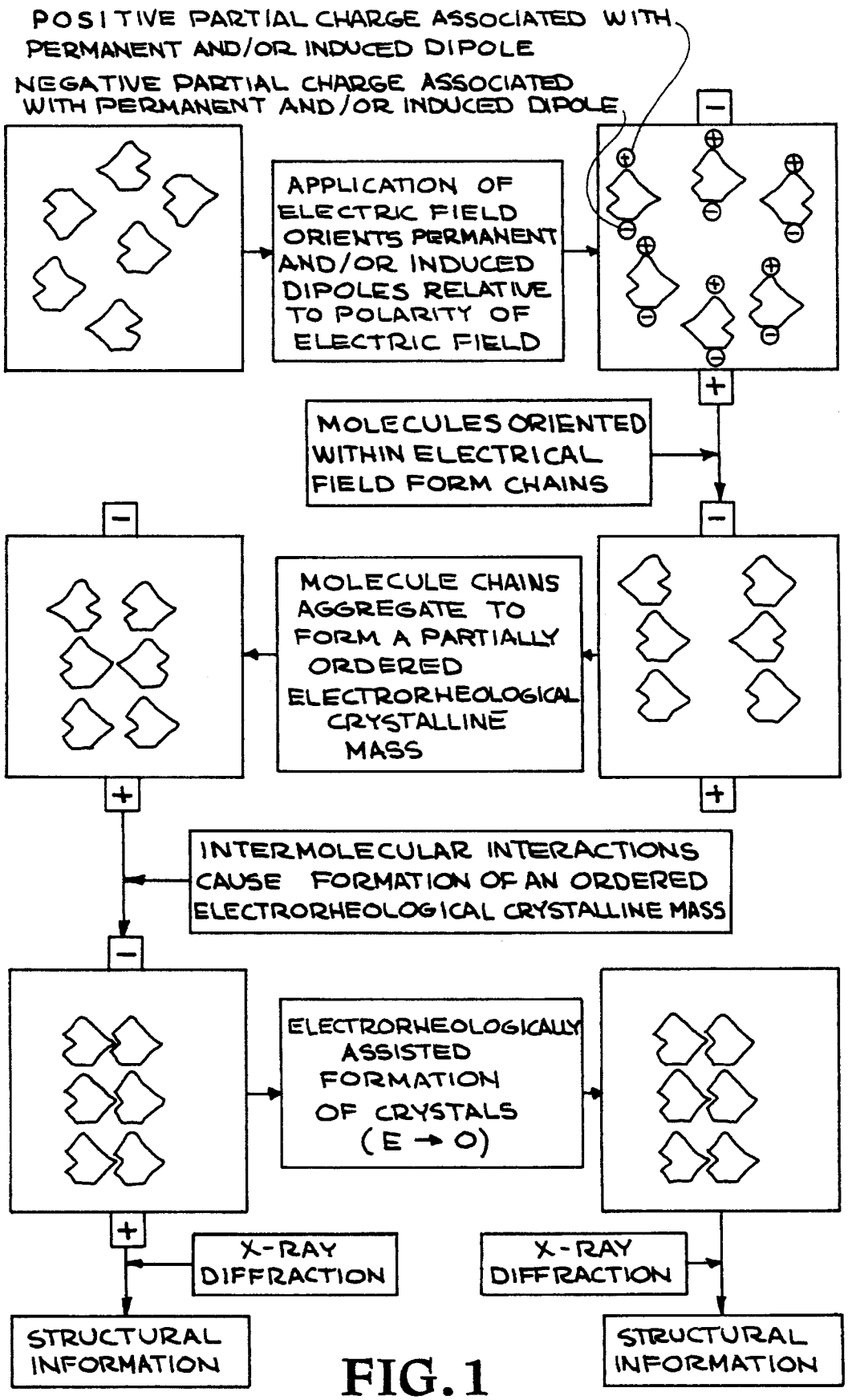
FIG. 1 illustrates the formation of an electrorheological crystalline mass and the crystallization of the mass.

According to the present invention, when a sample of a molecule is subjected to a uniform electric field, the attractive and repulsive forces exerted on the molecules due to their induced and/or permanent dipole moments cause the molecules to align relative to the electric field. The molecules then line up relative to each other, positive dipole end to negative dipole end, forming chains of molecules. The chains of molecules quickly grow in length until the chain extends to the opposing ends of the chamber holding the molecular dispersion. Meanwhile, the chains of molecules combine to form chains of increasing thicknesses until an electrorheological crystalline mass of molecules is formed. It is believed that the chains aggregate because the molecules respond to the sum of the forces from the other dipoles in the fluid. The formation of an electrorheological crystalline mass and the crystallization of the electrorheological crystalline mass is illustrated in FIG. 1.

The electrorheological crystalline mass of molecules may be used to facilitate and accelerate the formation of x-ray diffraction quality crystals of molecules. Each molecule within the crystalline mass has the same orientation relative to the other molecules within the crystalline mass due to permanent and/or induced dipole interactions. The molecules are also in close proximity with each other where intermolecular forces become significant. As a result, the entropy barrier to crystallization is significantly reduced, thereby facilitating and accelerating the formation of an actual crystal lattice.

Crystals formed by electrorheology are evaluated for diffraction quality, and if suitable, subjected to x-ray diffraction in order to determine the three dimensional structure of the molecule. Although crystals which provide at least 3Å resolution diffraction patterns are preferred, crystals whose x-ray diffraction patterns provide any amount of structural information for the molecule are useful and desirable.

In some instances, the electrorheological crystalline mass is sufficiently ordered so as to enable x-ray diffraction of the crystalline mass. The electrorheological crystalline mass may be preserved for x-ray diffraction by maintaining the uniform electric field during x-ray diffraction. Alternatively, the electrorheological crystalline mass may be preserved for x-ray diffraction by cryogenically cooling the crystalline mass prior to removal of the uniform electric field. Cryogenic cooling may be performed by cooling the crystalline mass in a cold nitrogen stream to −125° C. or cooler, as described in Hope, H., *Acta. Cryst.* (1988) B44:22–26. After the container with the electrorheological sample has been rapidly cryocooled, the sample is stable and the electric field and the sample container can be removed to facilitate the mounting of the crystal for the x-ray diffraction experiment as described in the above reference.

Electrorheology is performed in a container having a chamber within which a uniform electric field is formed. There are no limitations to the geometric design or size of the chamber. Rather, the dimensions of the chamber are limited solely by one's ability to form a uniform electrical field within the chamber. It is generally desirable to scan the crystals and crystalline masses without removing them from the container. It is therefore preferred that the container have a cylindrical geometry in order to facilitate the use of the container within an x-ray diffraction apparatus.

In general, the electrorheology container is preferably formed of an electrical insulating material, such as glass, plastic and thin polymer films. It is preferred that the insulating material not distort the electric field inside the container in order to enable the creation of as uniform an electric field as possible.

Any electrode design may be used in the present invention which creates a substantially uniform electrical field within the container. In general, the electrodes are preferably wider than the diameter of the electrorheological container, thereby facilitating the formation of a uniform electric field within the container. In one embodiment, the positive and negative electrodes are formed of a conducting layer placed on opposite ends of an electrorheology container. In this embodiment, the conducting layer is preferably made of a highly conducting, oxidation resistant metal such as iridium, platinum, gold or copper.

Figure 2:
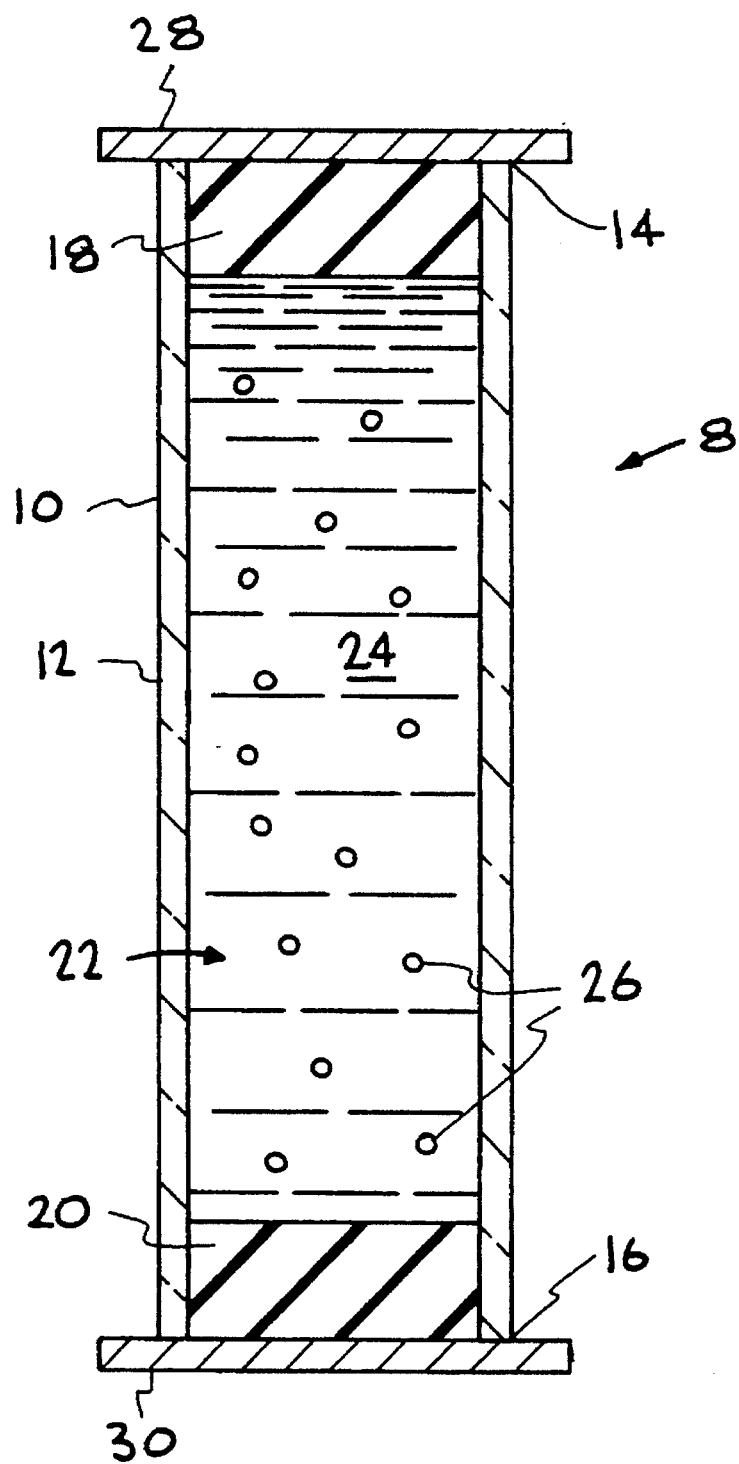
FIG. 2 illustrates a preferred embodiment for an electrorheology container.

FIG. 2 illustrates a container within which electrorheology may be performed. The electrorheology container 8 illustrated in FIG. 2 is formed of a tube 10 having a cylindrical outer wall 12 and two ends 14, 16. Plugs 18, 20 are used to seal the two ends 14, 16 of the tube 10 to define a chamber 22 within which the electrorheological dispersion fluid 24 containing the molecules 26 is placed.

The plugs 18, 20 used to seal the tube 10 and form the chamber 22 are preferably made of a dielectric material, most preferably a soft material such as wax. The dielectric material serves to space the positive and negative electrodes 28, 30 from the chamber 22 which facilitates the formation of a uniform electrical field within the chamber 22.

Figure 3:
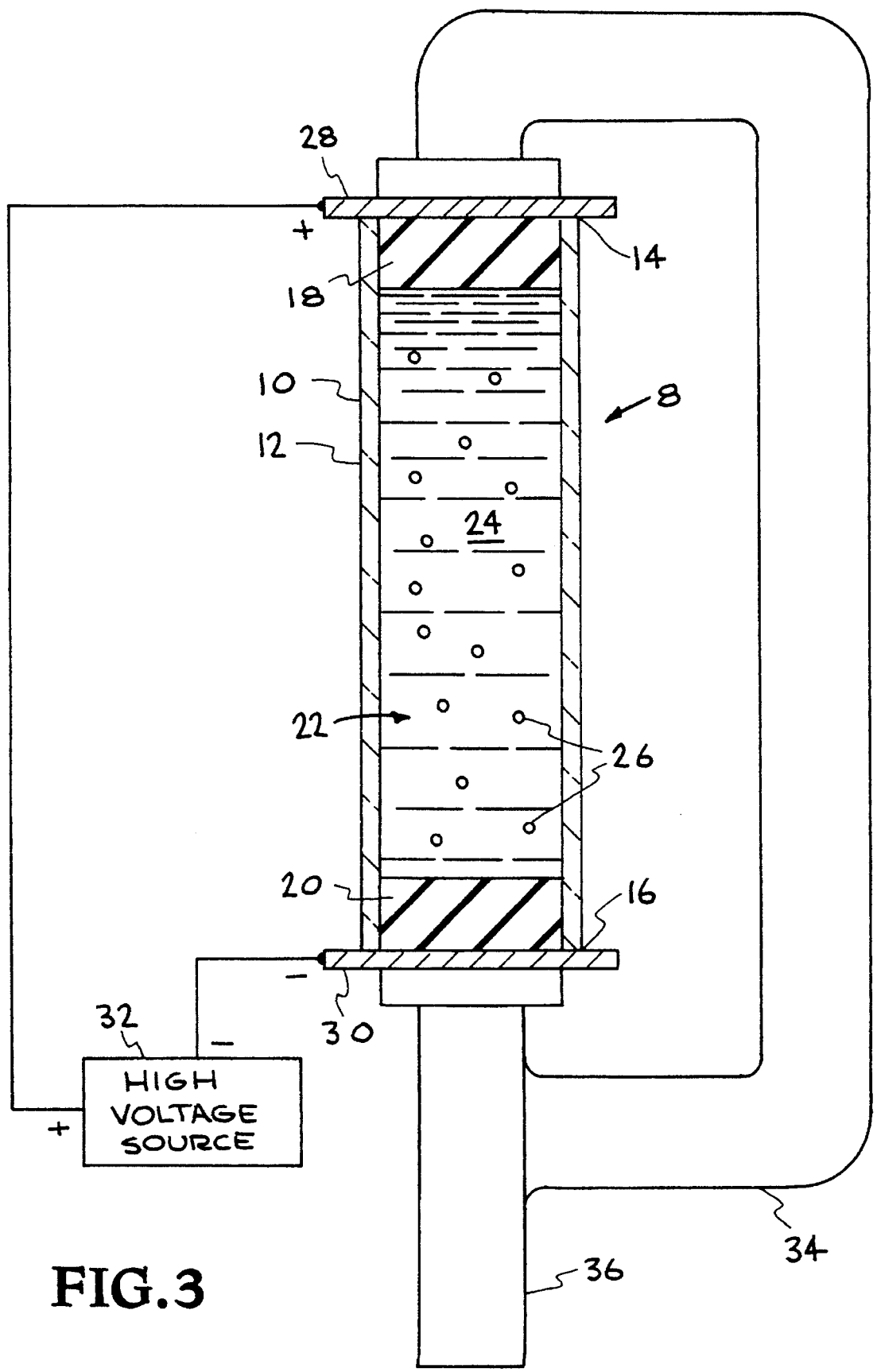
FIG. 3 illustrates the electrorheology container illustrated in FIG. 2 connected to a high voltage source in which positive and negative electrodes are positioned at either end of the container.

As illustrated in FIG. 3, electrorheology is performed on the molecules 26 in the chamber 22 by placing a positive and negative electrode 28, 30 at either end of the tube 10. A high voltage source 32 is attached to the electrodes in order to create an electric field between the electrodes and within the chamber 22. The electrorheology container 8 may be held in place relative to the electrodes using a clamp 34. The clamp is preferably made of a nonconducting material, such as Teflon, in order to insulate the positive and negative electrodes from each other. A support 36 may be used to hold and position the clamp.

Figure 4:
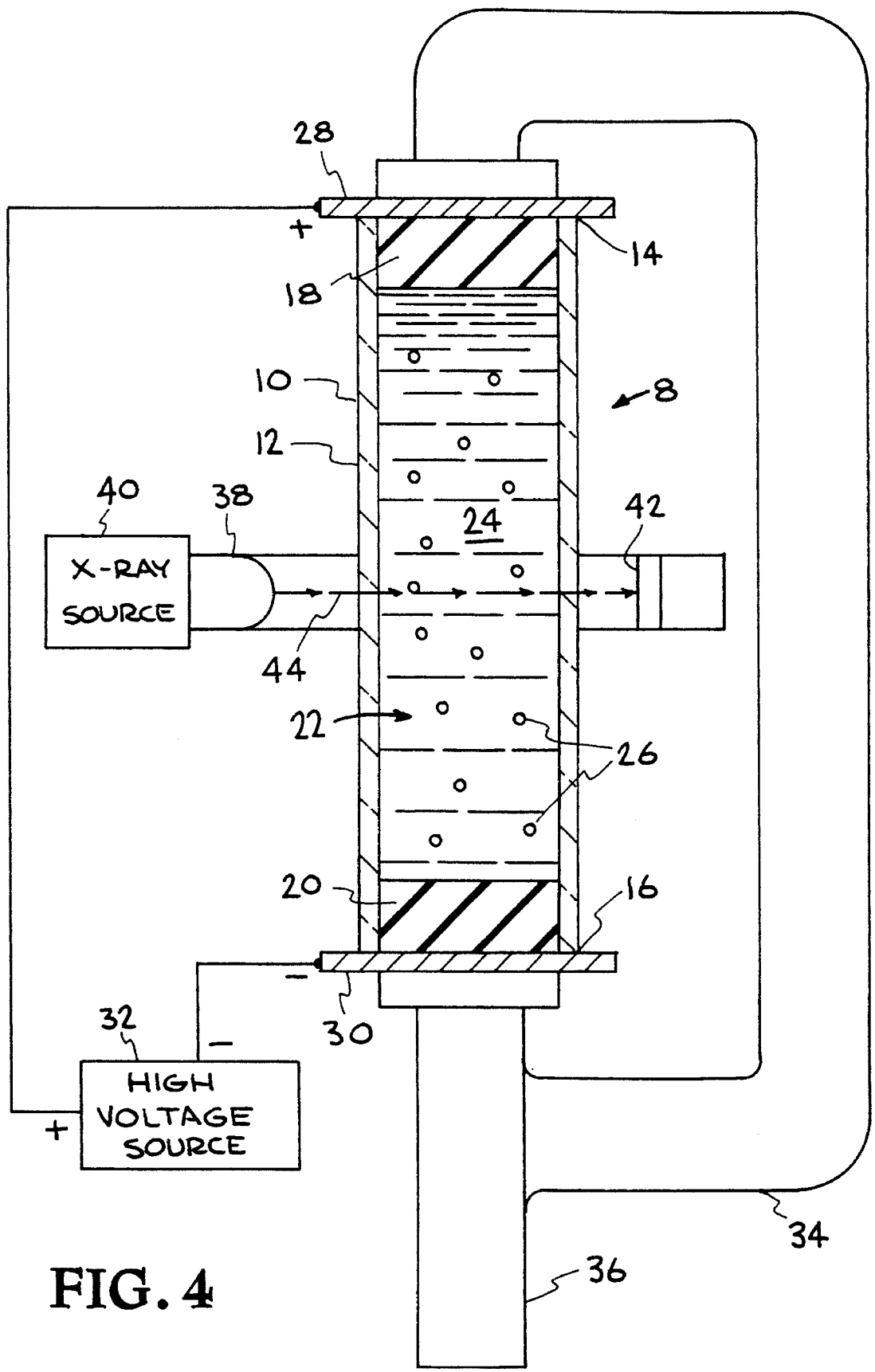
FIG. 4 illustrates a goniometer having an x-ray source and an x-ray beam stop positioned such that x-rays from the x-ray source traverse the electrorheology chamber.

As illustrated in FIG. 4, a goniometer 38 having an x-ray source 40 and an x-ray stop 42 may be positioned such that x-rays 44 from the x-ray source 40 traverse the electrorheology chamber 22. The goniometer 38 enables the x-ray beam 44 to be positioned at all angles relative to the electrorheology chamber 22, thereby enabling the crystals and crystalline masses to be scanned at all angles without being removed from the electrorheological container 8.

The electrical field must be sufficiently strong to create an electrorheological effect but should not be so strong as to result in a discharge. In general, it is preferred that the electric field be on the order of 1–10 kV/mm. The 1–10 kV/mm range for the electric field for creating an electrorheological effect is based on the Gast number ($\lambda$) which is the ratio of the induced dipole-dipole interaction energy and the energy of the Brownian motion of the fluid.

$$\lambda = \frac{\pi \epsilon_0 \epsilon_f a_p^3 (\beta E)^2}{kT}$$

$$\beta = \frac{\epsilon_p - \epsilon_f}{\epsilon_p + 2\epsilon_f}$$

where, in MKSA units, $a_p=$ the radius of the colloidal particle, $E=$ the applied electric field, $\beta=$ the particle dipole coefficient, $T=$ the absolute temperature, $\epsilon_f$ and $\epsilon_p$ are the dielectric constants of the dispersion fluid and the particle, respectively, and $\epsilon_0 = 8.85 \times 10^{-12}$ f/m and $k= 1.38 \times 10^{-23}$ j/deg. Gast, et al., "Electrorheological Fluids as Colloidal Suspension" *Adv. Colloid and Interface Science.* (1989) 30: 178.

The electric field strength in terms of the Gast number is given by $$E = \sqrt{\frac{\lambda kTd}{\pi \epsilon_0 a_p^3}}$$

where $d \simeq 1/\epsilon_f \beta^2$. This expression implies that the electric field strength is minimized by choosing a dispersion fluid with a dielectric constant $\epsilon_f \simeq \epsilon_p/5$. Then $\beta \simeq 0.6$ and $d \simeq 15/\epsilon_p$. The Gast number for the fluid-to-crystal phase transition is given by $\lambda \simeq 10$. Melrose, J. R., "Sheared Dipolar Suspension", *Phys. Rev. A* (1991) 44:R4789.

Based on these equations, the electric field strength (E) required to electrorheologically crystallize large proteins, or viruses or macromolecular assemblies at room temperature is approximately 1.6 MV/m ($a_p= 1000$Å and $\epsilon_p=10$). This is less than the breakdown strength of typical dispersion fluids, e.g. oils, and is comparable to field strengths used in the numerous studies of the shear strength of electrorheological fluids. This field strength is also consistent with the available experimental evidence that electrorheologically induced dichroism is observed in a colloidal solution of 1500Å particles at E= 1.0 MV/m. Fuller, et al., "Field Induced Anisotrophy in Concentrated Systems of Rigid Particles and Macromolecules", *J. Stat. Phys.* (1991) 62:1025.

Electrorheology is performed while the molecule is dispersed within a dispersion fluid. The dispersion fluid may be any fluid in which an electrorheological effect can be created. As detailed above, the ratio of the dielectric constants of dispersion fluid to particle (represented by the molecules, as such or in a solution of activator fluid) should be of a ratio of about 1:5. Other ratios are possible, but will require higher field strength or the use of larger molecular assemblies to create an electrorheological effect. The dispersion fluid may be used in any proportion to the molecule which creates a stable suspension of the molecule in the dispersion fluid. The dispersion fluid should preferably be resistant to decomposition in the presence of strong electrical fields and should not cause the denaturation of the molecule.

The dispersion fluid should be selected such that the molecules suspended in the dispersion fluid form an induced dipole more easily than the dispersion fluid. The dispersion fluid preferably is a nonpolar liquid with a dielectric constant suitable to satisfy the 1:5 ratio of dielectric constants as described above. A low dielectric constant (1–3) is suitable in most cases.

Preferred dispersion fluids include hydrocarbons such as aliphatic hydrocarbons, aromatics, halogenated aromatics and oils which do not denature the molecule. Oils may be natural or synthetic and may include, for example, mineral oil, corn oil, olive oil, silicone oil, spindle oil, naphthenic oil, Vaseline oil, transformer oil and paraffin oil.

An activator fluid may be used in combination with or in place of the dispersion fluid. The activator fluid is immiscible with the dispersion fluid and preferably has a dielectric constant greater than 3. The activator fluid is used to solvate the molecule and may include any fluid commonly used to crystallize the particular type of molecule. An aqueous solution is the most preferred activator fluid. The activator fluid may contain any chemical additive commonly used to facilitate the crystallization of the molecule being crystallized. Such additives include salts, surfactants, precipitants, organic solvents and detergents. Which additive(s) to employ depends on the properties of the specific protein or macromolecule to be crystallized, as discussed in McPherson, *Eur. J. Biochem.* (1990) 189:1–23 and DuCruix, et al., (Eds.) *Crystallization Of Nucleic Acids And Proteins: A Practical Approach* Oxford University Press, New York, 1992 which is incorporated herein by reference. For example, many proteins are more likely to crystallize at pH conditions close to their isoelectric point.

The ratio of activator fluid to molecule is dependent on the solubility of the molecule in the activator fluid where the addition of too much activator fluid impedes the crystallization of the molecule. With regard to the use of an aqueous solution as an activator fluid for proteins, it is preferred that the water to protein ratio be between about 20:1 and 1:1 mass:mass, most preferably between about 10:1 and 1:1.

It is believed that an induced moment is created in some instances by the creation of an induced charge sphere around the molecule. The activator fluid is generally a polar solvent, such as water, which itself can become polarized by the electric field. When polarized by the electric field, the activator fluid can shield the induced moment created in the molecule. In these instances, the amount of activator fluid used should be minimized.

In other instances, it may be preferred that an activator fluid, such as an aqueous solution containing a mixture of the additives described above be used as both the dispersion fluid and the activator fluid. This is preferred in cases where crystallization conditions for the generation of substandard crystals are known and the crystallization conditions need to be modified to produce a diffraction quality crystal.

One concern with regard to the performing electrorheology on molecules such as proteins is denaturation. Denaturation is most frequently associated with protein denaturation where heat or a chemical agents disrupts the three-dimensional structure of the protein. Since the formation of a diffraction quality crystal necessitates that the molecules forming the crystals have the same three dimensional structure, incorporation of denatured molecules into the crystal can severely reduce the diffraction quality of the crystal. It is therefore important that dispersion fluids and activator fluids be selected that do not denature the molecule. In addition, additives may be introduced to the dispersion fluid and activator fluid which serve to reduce denaturation.

For example, some proteins and their crystals are sensitive to dispersion in oil (for example, Concanavalin A, private communication Sean Parkin and B. Rupp, LLNL) but behave well in cryopreservatives such as 2-Methyl-Pentane Diol (MPD). On the other hand, very hydrophilic proteins tend not to leave their protecting coat of aqueous (activator) solution when dispersed in oil (ribosome crystals can be manipulated in oil without damage). These properties are specific to the protein in question and do not present limitations on the electrorheological crystallization method itself.

Electrorheology may be performed over a wide temperature range, preferably between about –30° and 70° C. At temperatures below –30° C., most cryoprotectants used in protein crystallography become ineffective. At temperatures above 70° C., proteins tend to denature thermally. These properties are specific to the protein and are not limitations of the electrorheological crystallization method. Lower temperatures also reduce the effect of Brownian motion energy (kT) and therefore increase the effectiveness of the electrorheological effect as can be seen from the equation for the Gast number given above. In general, electrorheology should be performed at a temperature which does not cause the denaturation of the molecule. At lower temperatures, i.e., below 0° C., a cryoprotectant, such as glycerol, 2-Methyl-Pentane Diol (MPD), or Poly Ethylene Glycols (PEGs) generally must be added to the protein solution (activator fluid).

An electrorheology container and the method of the present invention are illustrated by the following examples. Further objectives and advantages other than those set forth above will become apparent from the examples and accompanying drawings.

EXAMPLES

1. Electrorheological Crystallization Of A Protein

An electrorheological crystallization of a protein may be performed by first dissolving 10 mg of a homogeneous sample of a protein in 50 μl of water. The aqueous protein solution is then dispersed in 50 μl of paraffin oil.

The dispersion is then placed within the chamber 22 of the electrorheology container 8 illustrated in FIGS. 2–4. Approximately 1–10 kV/mm is applied to the electrodes 28, 30, thereby creating a uniform electric field within the chamber. The electric field is maintained until an electrorheological effect is observed, i.e., when the solution solidifies and an electrorheological crystalline mass forms.

While maintaining the electric field, the sample may be analyzed by x-ray diffraction in order to determine whether the mass produces a satisfactory diffraction pattern for determining the three dimensional structure of the protein. In the alternative, the electrical field may be maintained for a period of time until an actual crystal forms. Once formed, the crystal may be analyzed by x-ray diffraction in order to determine whether the crystal produces a satisfactory diffraction pattern for determining the three dimensional structure of the protein.

2. Electrorheologically Assisted Crystallization Of A Protein Without Dispersion Fluid Electrorheologically assisted crystallization is applied to cases where no dispersion fluid can be used in combination with a particular protein or when the modification of already known crystallization conditions is necessary (e.g. to change the crystal habit, or to improve diffraction quality). In such cases, the electrorheological orientation effect may be too small to create ab-initio electrorheological crystallization (see Gast equation) but can be sufficient to change crystal habit, structure, or quality of the crystal while the crystal is growing from solution. An electrorheologically assisted crystallization is described below.

A solution of Hen Egg White Lysozyme (HEWL) (50 mg/ml) in 50 mM Sodium Acetate buffer (pH 4.5) is first prepared. The HEWL solution is then added in a 1:1 V:V ratio to a series of sodium chloride solutions having a molarity between 0.8 M and 2.0 M. Each HEWL-sodium chloride solution is then placed within a chamber 22 of an electrorheology container 8 illustrated in FIGS. 2–4. Approximately 1–10 kV/mm is applied to the electrodes 28, 30, thereby creating a uniform electric field within the chamber 22. The electric field is maintained until crystallization occurs. The resulting electrorheological crystal may then be scanned for the presence of a satisfactory diffraction pattern.

While the present invention is disclosed by reference to the preferred embodiments and examples detailed above, it is to be understood that these examples are intended in an illustrative rather than limiting sense, as it is contemplated that modifications will readily occur to those skilled in the art, which modifications will be within the spirit of the invention and the scope of the appended claims.

We claim:

1. A diffraction quality electrorheological crystalline mass of a molecule, the electrorheological crystalline mass being formed by:

dispersing a molecule in an electrorheological dispersion fluid; and subjecting the molecule dispersion to a uniform electrical field for a period of time during which time a diffraction quality electrorheological crystalline mass is formed.

2. An electrorheological crystalline mass according to claim 1 wherein the molecule has a diameter less than about 0.04 μm.

3. An electrorheological crystalline mass according to claim 2 wherein the molecule is a biomolecule selected from the group consisting of a protein, a nucleic acid, a carbohydrate, a lipoprotein and a virus.

4. An electrorheological crystalline mass according to claim 3 wherein the biomolecule is a protein.

5. An electrorheological crystalline mass according to claim 1 wherein the molecule dispersion further includes an activator fluid.

6. An electrorheological crystalline mass according to claim 5 wherein the activator fluid is aqueous.

7. An electrorheological crystalline mass according to claim 5 wherein the dispersion fluid and the activator fluid are aqueous.

8. An electrorheological crystalline mass according to claim 1 wherein the uniform electrical field is about 1–10 kV/mm.

9. An electrorheological crystalline mass according to claim 1 wherein the dispersion fluid is a nonpolar liquid with a dielectric constant between about 1 and 3.

10. An electrorheological crystalline mass according to claim 1 wherein the dispersion fluid is selected from the group consisting of: aliphatic hydrocarbons, aromatics, halogenated aromatics and oils.

11. An electrorheological crystalline mass according to claim 1 wherein the electrorheological crystalline mass has sufficient diffraction quality to produce a diffraction pattern that can be used to calculate the three-dimensional structure of the molecule with at least 3Å resolution.

12. A method for forming a diffraction quality electrorheological crystalline mass of a molecule comprising the steps of:

dispersing a molecule in an electrorheological dispersion fluid; and subjecting the molecule dispersion to a uniform electrical field for a period of time during which time a diffraction quality electrorheological crystalline mass is formed.

13. A method according to claim 12 wherein the molecule has a diameter less than about 0.04 μm.

14. A method according to claim 13 wherein the molecule is a biomolecule selected from the group consisting of a protein, a nucleic acid, a carbohydrate, a lipoprotein and a virus.

15. A method according to claim 14 wherein the biomolecule is a protein.

16. A method according to claim 12 wherein the molecule dispersion further includes an activator fluid.

17. A method according to claim 16 wherein the activator fluid is aqueous.

18. A method according to claim 16 wherein the dispersion fluid and the activator fluid are aqueous.

19. A method according to claim 12 wherein the uniform electrical field is about 1–10 kV/mm.

20. A method according to claim 12 wherein the dispersion fluid is a nonpolar liquid with a dielectric constant between about 1 and 3.

21. A method according to claim 12 wherein the dispersion fluid is selected from the group consisting of: aliphatic hydrocarbons, aromatics, halogenated aromatics and oils.

22. A method for crystallizing a molecule comprising the steps of:

dispersing a molecule in an electrorheological dispersion fluid;

subjecting the molecule dispersion to a uniform electrical field for a period of time during which time an electrorheological crystalline mass is formed; and maintaining the electric field for a second period of time during which time the molecules making up the electrorheological crystalline mass crystallize to form a diffraction quality crystal.

23. A method according to claim 22 wherein the molecule has a diameter less than about 0.04 μm.

24. A method according to claim 23 wherein the molecule is a biomolecule selected from the group consisting of a protein, a nucleic acid, a carbohydrate, a lipoprotein and a virus.

25. A method according to claim 23 wherein the biomolecule is a protein.

26. A method according to claim 22 wherein the molecule dispersion further includes an activator fluid.

27. A method according to claim 26 wherein the activator fluid is aqueous.

28. A method according to claim 26 wherein the dispersion fluid and the activator fluid are aqueous.

29. A method according to claim 22 wherein the uniform electrical field is about 1–10 kV/mm.

30. A method according to claim 22 wherein the dispersion fluid is a nonpolar liquid with a dielectric constant between about 1 and 3.

31. A method according to claim 22 wherein the dispersion fluid is selected from the group consisting of: aliphatic hydrocarbons, aromatics, halogenated aromatics and oils.

32. A method according to claim 31 wherein the molecule dispersion further includes a detergent.

33. A method according to claim 22, the method further comprising the step of subjecting the molecule crystal to x-ray diffraction to produce a diffraction pattern from which structural information regarding the molecule can be determined.

34. A method according to claim 33 further comprising calculating the three-dimensional structure of the molecule with at least 3Å resolution.

35. A method for determining the three dimensional structure of a molecule comprising the steps of:

dispersing a molecule in an electrorheological dispersion fluid;

subjecting the molecule dispersion to a uniform electric field for a period of time during which time an electrorheological crystalline mass is formed;

maintaining the electric field for a second period of time during which time the molecules making up the electrorheological crystalline mass form a diffraction quality crystal lattice;

subjecting the crystal lattice to x-ray diffraction to produce a diffraction pattern; and calculating the three dimensional structure of the molecule from the x-ray diffraction pattern.

36. A method according to claim 35 wherein the molecule has a diameter less than about 0.04 µm.

37. A method according to claim 36 wherein the molecule is a biomolecule selected from the group consisting of a protein, a nucleic acid, a carbohydrate, a lipoprotein and a virus.

38. A method according to claim 37 wherein the biomolecule is a protein.

39. A method according to claim 35 wherein the molecule dispersion further includes an activator fluid.

40. A method according to claim 39 wherein the activator fluid is aqueous.

41. A method according to claim 39 wherein the dispersion fluid and the activator fluid are aqueous.

42. A method according to claim 35 wherein the uniform electrical field is about 1–10 kV/mm.

43. A method according to claim 35 wherein the dispersion fluid is a nonpolar liquid with a dielectric constant between about 1 and 3.

44. A method according to claim 35 wherein the dispersion fluid is selected from the group consisting of: aliphatic hydrocarbons, aromatics, halogenated aromatics and oils.

45. A method for determining the three dimensional structure of a molecule comprising the steps of:

dispersing a molecule in an electrorheological dispersion fluid;

subjecting the molecule dispersion to a uniform electric field for a period of time during which time a diffraction quality electrorheological crystalline mass is formed;

obtaining an x-ray diffraction pattern of the electrorheological crystalline mass; and calculating the three dimensional structure of the molecule from the x-ray diffraction pattern.

46. A method according to claim 45 wherein the molecule has a diameter less than about 0.04 µm.

47. A method according to claim 46 wherein the molecule is a biomolecule selected from the group consisting of a protein, a nucleic acid, a carbohydrate, a lipoprotein and a virus.

48. A method according to claim 47 wherein the biomolecule is a protein.

49. A method according to claim 45 wherein the molecule dispersion further includes an activator fluid.

50. A method according to claim 49 wherein the activator fluid is aqueous.

51. A method according to claim 49 wherein the dispersion fluid and the activator fluid are aqueous.

52. A method according to claim 45 wherein the uniform electrical field is about 1–10 kV/mm.

53. A method according to claim 45 wherein the dispersion fluid is a nonpolar liquid with a dielectric constant between about 1 and 3.

54. A method according to claim 45 wherein the dispersion fluid is selected from the group consisting of: aliphatic hydrocarbons, aromatics, halogenated aromatics and oils.

* * * * *